(12) United States Patent
Yano et al.

(10) Patent No.: US 7,869,292 B2
(45) Date of Patent: Jan. 11, 2011

(54) DYNAMIC TYPE SEMICONDUCTOR MEMORY DEVICE AND OPERATION METHOD OF THE SAME

(75) Inventors: Nobumitsu Yano, Kanagawa (JP); Shogo Tanabe, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 23 days.

(21) Appl. No.: 12/502,692

(22) Filed: Jul. 14, 2009

(65) Prior Publication Data
US 2010/0008172 A1   Jan. 14, 2010

(30) Foreign Application Priority Data
Jul. 14, 2008   (JP)   ................. 2008-182986

(51) Int. Cl.
*G11C 7/00*   (2006.01)
(52) U.S. Cl. ............... 365/203; 365/210.1; 365/210.12
(58) Field of Classification Search ................. 365/203, 365/222, 210.1, 210.12, 226, 149
See application file for complete search history.

(56) References Cited

U.S. PATENT DOCUMENTS 5,889,718 A    3/1999   Kitamoto et al.
6,272,062 B1*  8/2001   Mueller et al. ......... 365/230.02
6,714,473 B1*  3/2004   Fiscus .................... 365/189.07
6,788,112 B1*  9/2004   Chan et al. .................. 327/51

FOREIGN PATENT DOCUMENTS
JP   11-026720   1/1999

OTHER PUBLICATIONS

Barth et al., "A 300MHz Multi-Banked eDRAM Macro Featuring GND Sense, Bit-Line Twisting and Direct Reference Cell Write", ISSCC 2002/ Session 9/ DRAM and Ferroelectric Memories/ 9.3, 2002 IEEE International Solid-State Circuits Conference.

* cited by examiner

*Primary Examiner*—Gene N Auduong
(74) *Attorney, Agent, or Firm*—Young & Thompson

(57) ABSTRACT

A dynamic type semiconductor memory device includes a sense amplifier connected with a bit line pair to amplify and sense a voltage difference on the bit line pair; a precharge circuit configured to precharge the bit line pair to a power supply voltage on a lower side in response to a first control signal; a memory cell capacitance having one end which is connected with the bit line pair through a first switch circuit which is controlled in response to a signal on a word line; and a reference cell capacitance having one end which is connected with the bit line pair through a second switch circuit which is controlled in response to a signal on a reference word line. The other end of the memory cell capacitance and the other end of the reference cell capacitance are electrically separated.

13 Claims, 6 Drawing Sheets

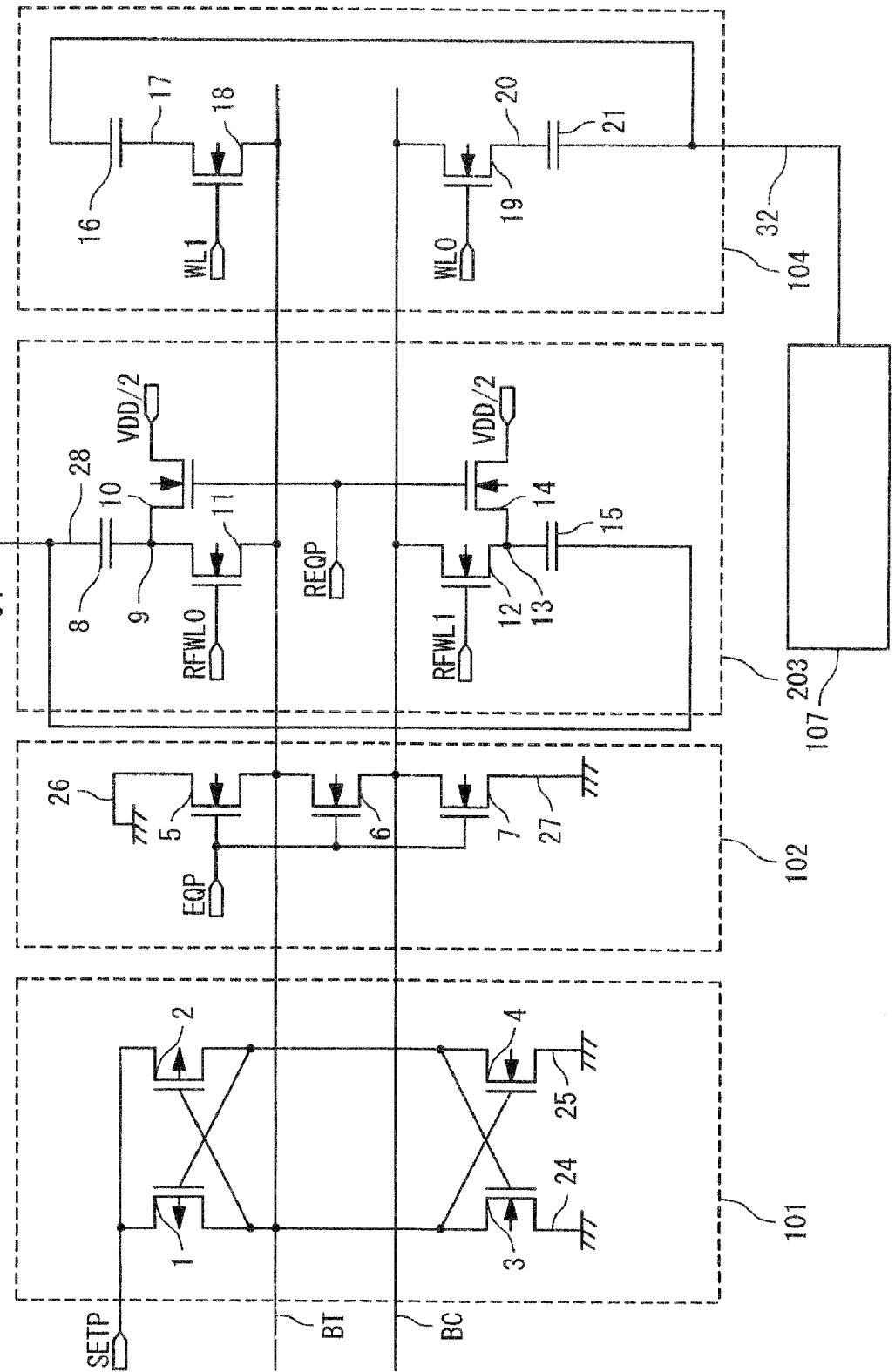

US 7,869,292 B2

DYNAMIC TYPE SEMICONDUCTOR MEMORY DEVICE AND OPERATION METHOD OF THE SAME

INCORPORATION BY REFERENCE

This patent application claims a priority on convention based on Japanese Patent Application No. 2008-182986 The disclosure thereof is incorporated herein by reference.

BACKGROUND OF THE INVENTION

1. Field of the Invention

The present invention relates to a dynamic type semiconductor memory device of a lower voltage side power supply voltage sensing and a voltage direct reference cell writing system.

2. Description of Related art

In recent years, along with advances in power saving of cellular phones and other system products, a semiconductor memory device indispensable for constituting such a system has been required to operate at lower voltage. For example, a DRAM (Dynamic Random Access Memory) operating at a low voltage of VDD=0.85 V or lower starts to become widely used. On the other hand, the semiconductor memory device operating at lower voltage is required to have performances such as a wide voltage operating range, a wide temperature operating range, and an unspecified noise resistance. In order to satisfy such required performances, the DRAM operating at lower voltage starts to employ a lower voltage side power supply voltage sensing (e.g., GND sensing) and direct reference cell writing system.

Re-distribution of charges accumulated in a memory cell capacitance in a DRAM does not start until a word line voltage becomes higher by a threshold voltage Vt than a bit line voltage. This means that when a slew rate of a signal is large or a word line is long, the word line becomes a critical path. For example, if a bit line is precharged to the voltage of VDD/2 (e.g. 1.5 V) with a signal having the slew rate of 1 V/ns in a conventional VDD/2 bit line precharge system, an extra delay of 750 ps occurs. On the other hand, in a GND precharge system using a reference cell, although a reference cell area (e. g., 1.5% of 16 megabits) is required, an equalizing margin of a bit line and Vgs of a sense amplifier transistor can be largely saved. Therefore, timing for activating a sense amplifier can be sped up.

In the precharge system using a reference cell, a reference cell pair is precharged to the voltage of VDD/2 in accordance with complementary write data during an active operation. In this case, twice operations of the reference cells such as a charging operation and an equalizing operation are performed so as to make a cycle time larger. As a method of preventing such increase in cycle time, there is a direct reference cell writing system. In the direct reference cell writing system, immediately after activation of a sense amplifier, a selected reference cell is turned off, and a connection between the reference cell and a bit line is disconnected. Then, the voltage of VDD/2 is directly written to a reference cell capacitance through a transistor. Thus, the charging operation and the equalizing operation are integrated, resulting in improvement of the cycle time. According to the direct reference cell writing system, not only the improvement of the cycle time, but a ratio of a signal amount and a retention time are optimized, and a high-speed signal margin is obtained by a reference voltage converted into a constant voltage.

A DRAM of the general direct reference cell writing system is described in, for example, "A 300 MHz Multi-Banked eDRAM Macro Featuring GND Sense, Bit-Line Twisting and Direct Reference Cell Write" (ISSCC 2002/Session 9/DRAM AND FERROELECTRIC MEMORIES/9.3).

Referring to FIG. 1, the general GND sensing and direct reference cell writing system used for a DRAM will be described. FIG. 1 is a circuit diagram illustrating a configuration of a part of a DRAM employing the direct reference cell writing system according to a conventional technique. The DRAM illustrated in FIG. 1 includes a latch type differential sense amplifier circuit 101, a precharge circuit 102, a reference voltage supply circuit 403, and a memory cell array 404 of memory cells, each of which is connected to bit lines BT and BC. The bit lines BT and BC may be collectively referred to as a bit line pair BT and BC.

The latch type differential sense amplifier circuit 101 operates between a latch type differential sense amplifier circuit supply voltage SETP and a ground voltage GND, and amplifies a voltage difference between the bit lines BT and BC.

The precharge circuit 102 has an equalizing function and a precharging function. Specifically, when a supplied precharge control signal EQP is in a high level, the precharge circuit 102 connects the bit lines BT and BC to a ground voltage GND to precharge them to a GND voltage (lower voltage side power supply voltage). Alternatively, if the precharge control signal EQP is in a low level, the precharge circuit 102 disconnects the connection between the bit lines BT and BC and the ground voltage GND, The reference voltage supply circuit 403 includes reference cell capacitances 8 and 15, and N-channel MOS transistors 10, 11, 12, and 14.

The reference cell capacitance 8 is connected to the ground voltage GND at one end thereof (opposite electrode node 28), and to the NMOS transistors 10 and 11 at the other end thereof (reference cell node 9) The reference cell capacitance 8 (reference cell node 9) is connected to a VDD/2 node (power supply node of a reference voltage (VDD/2)) through the NMOS transistor 10, and to the bit line BT through the NMOS transistor 11. The NMOS transistor 10 controls an electrical connection between the reference cell node 9 and the bit line BT in response to a signal supplied from a reference word line RFWL0 connected to a gate thereof. The NMOS transistor 11 controls an electrical connection between the reference cell node 9 and the VDD/2 node in response to a direct write control signal REQP (hereinafter to be referred to as a write signal REQP) supplied to a gate thereof.

The reference cell capacitance 15 is connected to the ground voltage GND at one end thereof (opposite electrode node 29), and to the NMOS transistors 12 and 14 at the other end thereof (reference cell node 13). The reference cell capacitance 15 (reference cell node 13) is connected to the power supply node VDD/2 (voltage value of VDD/2) through the NMOS transistor 14, and to the bit line BC through the NMOS transistor 12. The NMOS transistor 12 controls an electrical connection between the reference cell node 13 and the bit line BC in response to a signal supplied from a reference word line RFWL1 connected to a gate thereof. The NMOS transistor 10 controls an electrical connection between the reference cell node 9 and the power supply node VDD/2 in response to the write signal REQP supplied to a gate thereof.

In the reference voltage supply circuit 403, charges are stored in the reference cell capacitance 8 or 15 (hereinafter to be collectively referred to as a reference memory cell) from the VDD/2 node response to the write signal REQP. Also, the charges stored in the reference memory cell are re-distributed to the bit line pair BT and BC in response to the signals supplied to the reference word lines RFWL0 and REWL1.

The memory cell array 404 includes memory cell capacitances 16 and 21, and N-channel MOS transistors 18 and 19. The memory cell capacitance 16 is connected to the ground voltage GND at one end thereof (opposite electrode node 30), and to the bit line BT at the other end thereof (memory cell node 17) through the NMOS transistor 18. The NMOS transistor 18 controls an electrical connection between the memory cell node 17 and the bit line BT in response to a signal supplied from a word line WL1 connected to a gate thereof. The memory cell capacitance 21 is connected to the GND voltage at one end thereof (opposite electrode node 31), and to the bit line BC at the other end thereof (memory cell node 20) through the NMOS transistor 19. The NMOS transistor 19 controls an electrical connection between the memory cell node 20 and the bit line BC in response to a signal supplied from a word line WL0 connected to a gate thereof.

In the memory cell array 404, charges stored in the memory cell capacitance 16 or 21 (hereinafter to be collectively referred to as a memory cell) are read from the bit line pair BT and BC (read), or charges are stored in the memory cell from the bit line pair BT and BC (write). At this time, a memory cell subjected to the read or write is selected by activating the word line WL0 or WL1 connected thereto.

In the DRAM illustrated in FIG. 1, the opposite electrode nodes 28 and 29 of the reference memory cells and the opposite electrode nodes 30 and 31 of the memory cells are all connected to the ground voltage GND. For this reason, if a high level voltage is applied to the reference cell node 9 or 13, or memory cell node 17 or 20, a voltage difference corresponding to the power supply voltage VDD is applied between the reference cell node 9 to 13 applied with the high level voltage and the corresponding opposite electrode node 28 to 31 applied with the ground voltage GND. Accordingly, a capacitance insulating film forming the memory cell capacitance is applied with the voltage difference corresponding to the power supply voltage VDD; and thereby may be broken. On the other hand, although not illustrated, similarly when any of the opposite electrode nodes is applied with the power supply voltage VDD, if a corresponding one of the memory cell nodes is applied with a low level voltage, a capacitance insulating film is applied with a voltage corresponding to the power supply voltage VDD, and thereby broken. From the above, it is necessary to connect a plate potential supply circuit 107 adapted to supply a voltage of ½ of the power supply voltage VDD to the opposite electrode nodes 18 to 29 as illustrated in FIG. 2.

FIG. 2 is a circuit diagram illustrating a configuration of a part of a DRAM of a direct reference cell writing system, which uses the plate potential supply circuit 107 and is mounted in a general product. The DRAM illustrated in FIG. 2 includes a reference voltage supply circuit 303 and a memory cell array 304 of which respective opposites electrode nodes 28 to 31 are connected to the plate potential supply circuit 107, instead of the reference voltage supply circuit 403 and memory cell array 404 in the DRAM illustrated in FIG. 1. The plate potential supply circuit 107 fixes the opposite electrode nodes 28 to 31 to ½ of the power supply voltage VDD, and therefore a voltage applied to the memory cell capacitance 16 or 21, or reference cell capacitance 8 or 15 becomes ½ of VDD or less. For this reason, in the DRAM illustrated in FIG. 2, any capacitance insulating film is not broken, differently from the DRAM illustrated in FIG. 1.

Also, as a related technique, a DRAM including a circuit adapted to control a voltage of a charge accumulation node of a dummy cell during a bit line precharge period is described in Japanese Patent Application Publication (JP-A-Heisei 11-026720).

If a memory size of the DRAM illustrated in FIG. 2 becomes larger (e.g., 16 megabits or more), wiring lines from the plate potential supply circuit 107 to far ends of the opposite electrode nodes 28 to 31 become longer, and have therefore a high impedance.

Recently, the opposite electrode nodes 28 to 31 connected with such high impedance are driven with a lower power supply voltage of 0.85 V of a lower power consumption amount. For this reason, charging speeds from the reference cell nodes 9 and 13 to the reference cell capacitances 8 and 15 in response to current variations are delayed, and coupling noises due to voltage variations of the reference cell nodes 9 and 13 are superimposed to the memory cell node 17 and 20 through the opposed electrode nodes 28 and 29, 30 and 31. Similarly, coupling noises due to voltage variations of the memory cell nodes 17 and 20 are superimposed to the reference cell nodes 9 and 13 through the opposite electrode nodes 28, 29, 30, and 31. From the above, voltage values of the memory cell nodes 17 and 20 and reference cell nodes 9 and 13 connected to the same bit lines are likely to be fluctuated by the influence of the respective voltage variations.

For example, upon charging/discharging to/from the memory cell or the reference cell, the coupling noises caused by the voltage variations of the memory cell nodes 17 and 20 and reference cell nodes 9 and 13 influence each other. Therefore, voltages of the opposite electrode nodes 28, 29, 30, and 31 upon restoring or sensing of the reference cell capacitances 8 and 15 and memory cell capacitances 16 and 21 are varied. Along with this, the voltage difference between the bit lines BT and BC decreases, and a sensing margin by the latch type differential sense amplifier circuit 101 is deteriorated.

Causes of the deterioration of the sensing margin in the DRAM illustrated in FIG. 2 will be described in detail. Here, a case will be described that high level data "1" is written (cell H write) to, or the high level data "1" is read (cell H read) from the memory cell (cell capacitance 21). When the reference word line RFWL0 is activated after the bit lines BT and BC have been precharged to the ground voltage GND, a voltage of the reference cell node 9 starts to change from the voltage of VDD/2 to the ground voltage GND. At this time, voltages of the opposite electrode nodes 28 to 31 also drop from the voltage of VDD/2 to the ground voltage GND due to coupling. The plate potential supply circuit 107 operates to restore the voltages of the opposite electrode nodes 28 to 31 to the voltage of VDD/2 in response to the voltage drops of the opposite electrode nodes 28 to 31. Subsequently, the write signal REQP is activated to restore the voltage of the reference cell node 9 from the ground voltage GND to the voltage of VDD/2, and the voltage of the opposite electrode node 28 becomes the voltage of VDD/2 due to coupling. However, if the plate potential supply circuit 107 has a low response speed, it operates to further raise the voltages of the opposite electrode nodes 28 to 31. In this case, the voltages of the opposite electrode nodes 28 to 31 become the voltage of VDD/2 or more. Therefore, an amount of charges accumulated in the memory cell becomes lower than an expectation value of the cell H (the charge amount to be detected as the high level data "1"). If such a state occurs during a period during which the word line WL0 is activated, a write error or a rewrite error occurs.

Also, when a low level data "0" is written (cell L write), or read (cell L read), an amount of charges accumulated in the memory cell may become larger than an expectation value of the cell L (charge amount to be detected as the low level data "0").

Specifically, when the reference word line RFWL0 is activated, the bit line BT precharged to the ground voltage GND varies the voltage of the reference cell node 9 from the voltage of VDD/2 to the ground voltage GND. For this reason, the voltage of the opposite electrode node 28 of the reference cell also drops from the voltage of VDD/2 to the ground voltage GND due to coupling. Subsequently, when the write control signal REQP transits to a high level, the voltage of the reference cell node 9 is restored from the voltage GND to the voltage of VDD/2. However, a time to restore the voltage of the reference cell node 9 to the voltage of VDD/2 may be long. Therefore, the voltage may not be restored to the voltage of VDD/2 before the activated word line falls. In particular, in a high speed cycle, the voltage of the reference cell node 9 at the time at which the word line falls may not be restored to the voltage of VDD/2. In such a case, due to coupling noise from the reference cell node 9 at the voltage of VDD/2 or lower, the voltages of the opposite electrode nodes 30 and 31 of the memory cell also become the voltage of VDD/2 or lower. For this reason, the amount of charges accumulated in the memory cell becomes larger than the expectation value of the cell L.

Further, in the DRAM illustrated in FIG. 2, a signal amount that is an expected charge amount accumulated in the bit lines upon read/write may be short. For example, in a cell H read or a cell H write cycle, when the reference word line RFWL0 is activated, the voltage of the reference cell node 9 is varied from the voltage of VDD/2 to the voltage GND. Therefore, the voltage of the opposite electrode node 28 of the reference cell is also decreased from the voltage of VDD/2 to the voltage GND due to coupling. This voltage variation propagates to the opposite electrode nodes 30 and 31 of the memory cells. Because the word line WL0 is activated, the voltage of the bit line BC is decreased due to coupling to decrease a voltage difference upon amplification. In such a state, when a read or write operation is started, a voltage variation due to the voltage variation at the reference cell node 9 decreases the voltage of the bit line BC through the memory cell node 20. Such a voltage variation of the bit line BC deteriorates the sensing margin of the amplifier. Similarly, when the reference word line RFWL1 is activated, the voltage variation of the bit line BT deteriorates the sensing margin of the amplifier.

SUMMARY

In an aspect of the present invention, a dynamic type semiconductor memory device includes a sense amplifier connected with a bit line pair to amplify and sense a voltage difference on the bit line pair; a precharge circuit configured to recharge the bit line pair to a power supply voltage on a lower side in response to a first control signal; a memory cell capacitance having one end which is connected with the bit line pair through a first switch circuit which is controlled in response to a signal on a word line; arid a reference cell capacitance having one end which is connected with the bit line pair through a second switch circuit which is controlled in response to a signal on a reference word line. The other end of the memory cell capacitance and the other end of the reference cell capacitance are electrically separated.

In another aspect of the present invention, an operation method of a dynamic type semiconductor memory device is achieved by precharging a bit line pair to a power supply voltage on a lower side; by supplying a reference voltage to a reference cell capacitance; by re-distributing charges stored in the reference cell capacitance between the reference cell capacitance and the bit line pair in a state that one end of the reference cell capacitance and one end of a memory cell capacitance are electrically separated; and by connecting the memory cell capacitance with the bit line pair.

As described above, the present invention can improve a sensing margin in a dynamic type semiconductor memory device of a lower voltage side power supply voltage sensing and voltage direct reference cell writing system.

BRIEF DESCRIPTION OF THE DRAWINGS

The above and other objects, advantages and features of the present invention will be more apparent from the following description of certain embodiments taken in conjunction with the accompanying drawings, in which:

FIG. 6 is a circuit diagram illustrating a configuration of a DRAM according of a second embodiment of the present invention.

DESCRIPTION OF PREFERRED EMBODIMENTS

Figure 1:
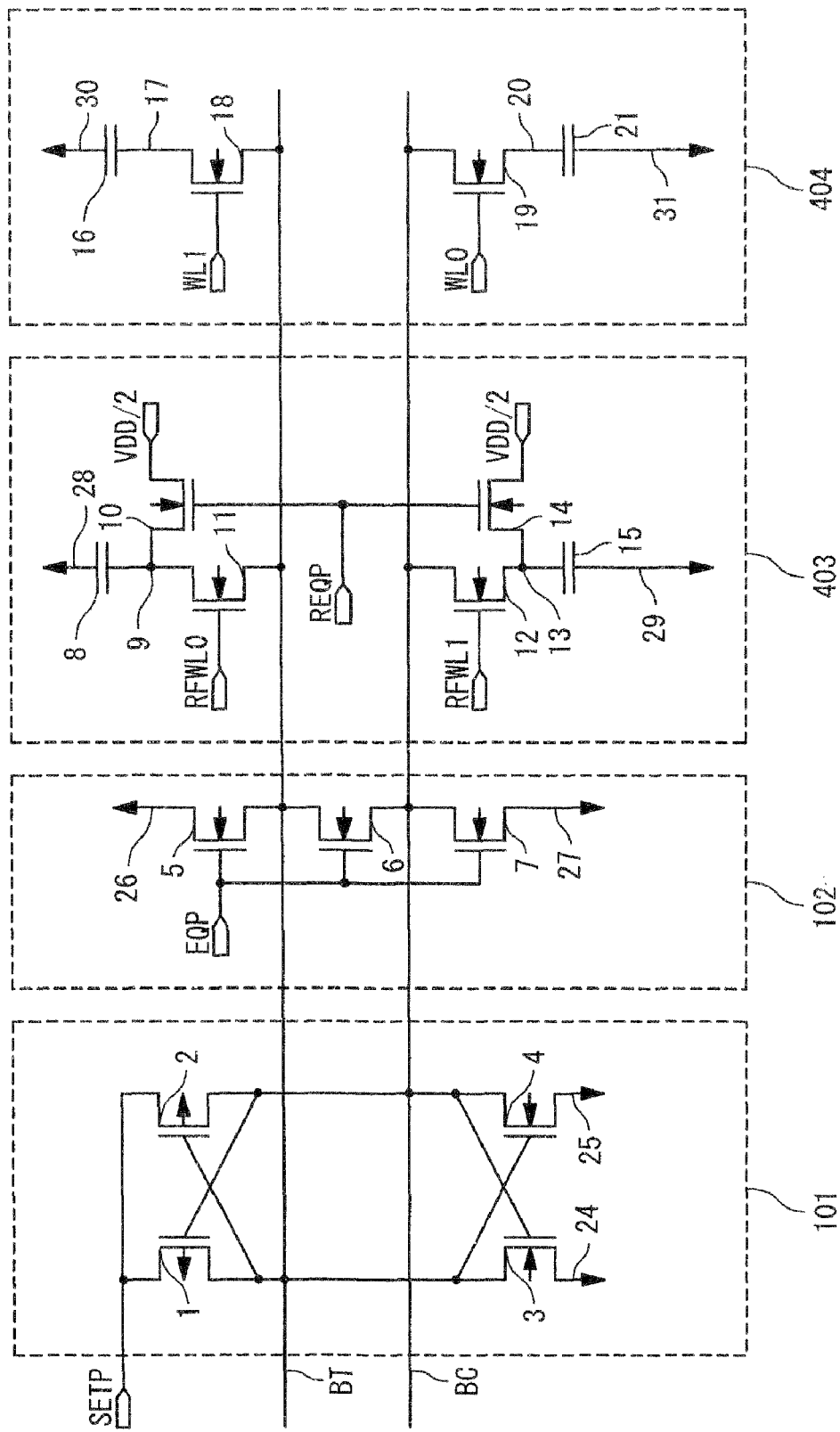
FIG. 1 is a circuit diagram illustrating a configuration of a DRAM according to a conventional technique.

Hereinafter, a semiconductor memory device of the present invention will be described with reference to the attached drawings. In the drawings, the same or similar reference symbols indicate the same or similar components.

First Embodiment

A DRAM using a direct reference writing system as a semiconductor memory device according to a first embodiment of the present invention will be described with reference to FIGS. 3 to 5.

(Configuration)

Figure 3:
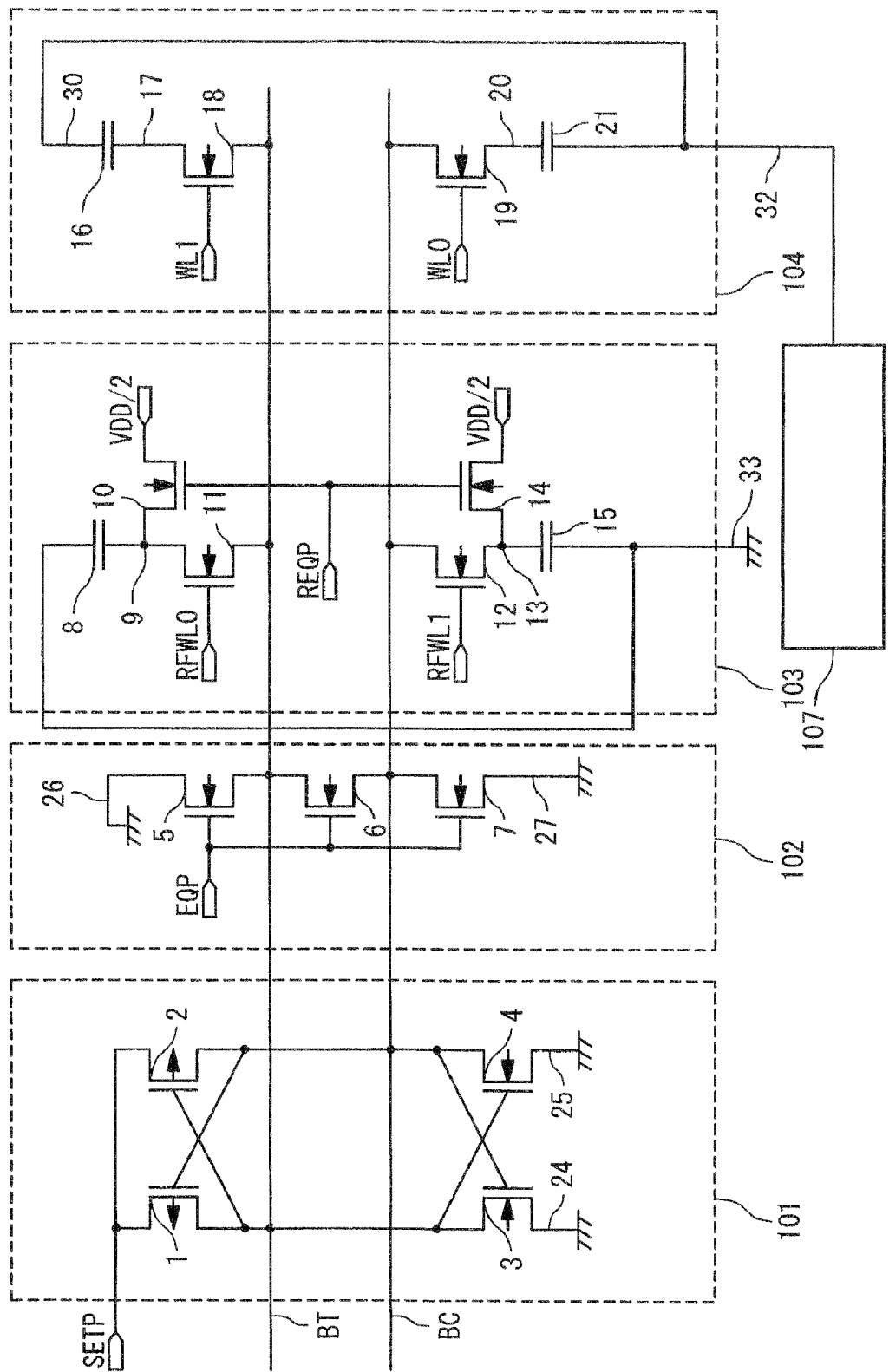
FIG. 3 is a circuit diagram illustrating a configuration of a DRAM according to a first embodiment of the present invention.

FIG. 3 is a circuit diagram illustrating a configuration of a part of a DRAM according to the first embodiment of the present invention. Referring to FIG. 3, the DRAM in the first embodiment includes a latch type differential sense amplifier circuit 101, a precharge circuit 102, a reference voltage supply circuit 103, a memory cell array 104, and a plate voltage supply circuit 107, each of which is connected to bit lines BT and BC. The bit lines BT and. BC may be collectively referred to as a bit line pair BT and BC.

The latch type sense amplifier circuit 101 includes a first differential pair including P-channel transistors 1 and 2 whose gates are connected to the bit lines BC and BT, and a second differential pair including N-channel transistors 3 and 4 whose gates are connected to the bit lines BC and BT. Drains of the P-channel and N-channel transistors of the differential pairs are connected through the bit lines BT and BC, respectively. Sources of the transistors of the first differential pair are connected to a power supply node supplied with a latch type differential sense amplifier circuit supply voltage SETP, and those of the transistors of the second differential pair are connected to ground voltage GND nodes 24 and 25 supplied with the GND voltage. By such a configuration, the latch type differential sense amplifier circuit 101 operates between the latch type differential sense amplifier circuit supply voltage SETP and the ground voltage GND, and amplifies a voltage difference between the bit lines BT and BC.

The precharge circuit 102 includes N-channel transistors 5 to 7 whose gates are supplied with a precharge control signal EQP. The N-channel transistor 5 is connected between a ground voltage GND 26 supplied with the ground voltage GND and the bit line BT. The N-channel transistor 5 controls an electrical connection between the bit line BT and the ground voltage GND 26 (precharge operation for the bit line BT) according to the precharge control signal EQP. The N-channel transistor 7 is connected between a ground voltage GND 27 supplied with a lower voltage side power supply voltage (ground voltage GND) and the bit line BC. The N-channel transistor 7 controls an electrical connection between the bit line BC and the ground voltage GND 27 (precharge operation for the bit line BC) according to the precharge control signal EQP. The N-channel transistor 6 is connected between the bit lines BT and BC. The N-channel transistor 6 controls an electrical connection between the bit lines BT and BC (equalizing operation) according to the precharge control signal EQP.

Based on such a configuration, the precharge circuit 102 has an equalizer function and a precharge function. Specifically, if the inputted precharge control signal EQP is at a high level, the precharge circuit 102 precharges the bit lines BT and BC to the ground voltage GND. Alternatively, in the case where the precharge control signal EQP is at a low level, the precharge circuit 102 disconnects electrical connections between the bit lines BT and BC and the ground voltage GND.

The reference voltage supply circuit 103 includes reference cell capacitances 8 and 15, and N-channel MOS transistors 10 to 14. The reference cell capacitance 8 is connected to a ground voltage GND at one end thereof (opposite electrode node 33) and to the NMOS transistors 10 and 11 at a reference cell node 9 as the other end. The reference cell node 9 is connected to a VDD/2 node through the NMOS transistor 10, and to the bit line BT through the NMOS transistor 11. It should be noted that the VDD/2 node is supplied with an intermediate voltage of VDD/2 between a higher voltage side power supply voltage VDD and the lower voltage side power supply voltage GND. The NMOS transistor 11 controls an electrical connection between the reference cell node 9 and the bit line BT in response to a signal supplied from a reference word line RFWL0 connected to a gate thereof. The NMOS transistor 10 controls an electrical connection between the reference cell node 9 and the VDD/2 node in response to a direct write control signal REQP (hereinafter, to be referred to as a write signal REQP) supplied to a gate thereof.

The reference cell capacitance 15 is connected to the ground voltage GND at one end thereof (opposite electrode node 33), and to the NMOS transistors 12 and 14 at a reference cell node 13 as the other end thereof. The reference cell node 13 is connected to a power supply node VDD/2 through the NMOS transistor 14, and to the bit line BC through the NMOS transistor 12. The NMOS transistor 12 controls an electrical connection between the reference cell node 13 and the bit line BC in response to a signal supplied from a reference word line RFWL1 connected to a gate thereof. The NMOS transistor 14 controls an electrical connection between the reference cell node 13 and the power supply node VDD/2 in response to the write signal REQP supplied to a gate thereof.

In the reference voltage supply circuit 103, charges are charged to the reference cell capacitances 8 and 15 (hereinafter to be referred to as reference memory cells collectively) from the VDD/2 nodes in response to the write signal REQP. Also, charges written to the reference memory cells are redistributed to the bit line pair BT and BC in response to signals supplied to the reference word lines RFWL0 and RFWL1.

The memory cell array 104 includes memory cell capacitances 16 and 21, and N-channel MOS transistors 18 and 19. The memory cell capacitance 16 is connected to the plate voltage supply circuit 107 at one end thereof (opposite electrode node 32), and through the NMOS transistor 18 to the bit line BT at a memory cell node 17 as the other end thereof. The NMOS transistor 18 controls an electrical connection between the memory cell node 17 and the bit line BT in response to a signal supplied from a word line WL1 connected to a gate thereof. The memory cell capacitance 21 is connected to the plate voltage supply circuit 107 at one end thereof (opposite electrode node 32), and through the NMOS transistor 19 to the bit line BC at a memory cell node 20 as the other end thereof. The NMOS transistor 19 controls an electrical connection between the memory cell node 20 and the bit line BC in response to a signal supplied from a word line WL0 connected to a gate thereof.

In the memory cell array 104, charges accumulated in the memory cell capacitances 16 and 21 (hereinafter, to be referred to as memory cells collectively) are read from the bit line pair BT and BC (read), or charges are charged to the memory cell from the bit line pair BT and BC (write). At this time, the memory cell subjected to the read or write operation is selected by activating the word line WL0 or WL1 connected thereto.

In FIG. 3, the pair of memory cells connected to the pair of bit lines BT and BC and the pair of word lines WL0 and WL1, and the pair of reference memory cells are illustrated for convenience of description. However, the DRAM is provided with a plurality of memory cells connected to pluralities of bit line pairs and word line pairs, and a plurality of reference memory cells in a matrix form.

The plate voltage supply circuit 107 supplies a voltage to fix a voltage of the opposite electrode node 32 of the memory cells at the voltage of VDD/2.

(Operation)

Figure 4:
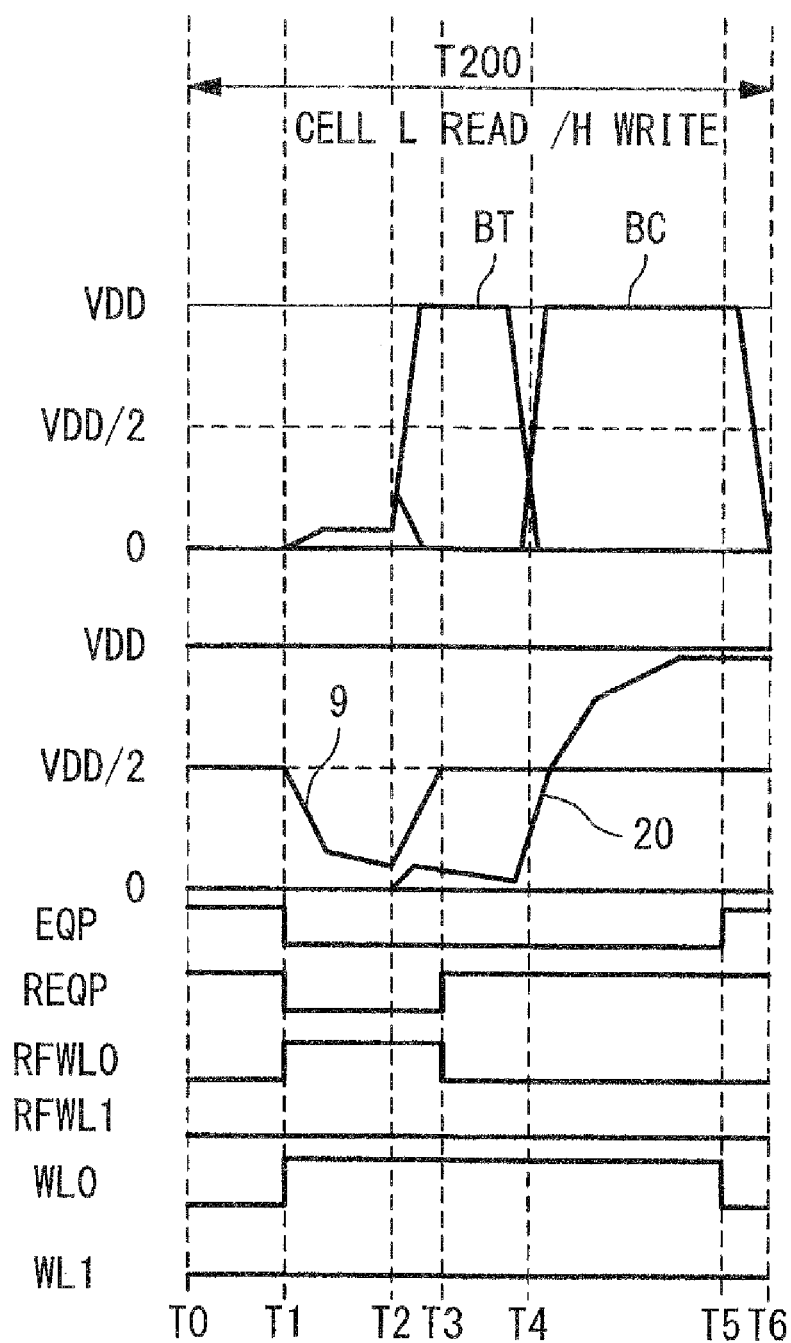
FIG. 4 shows time charts of an operation of the DRAM in the first embodiment of the present invention.
Figure 5:
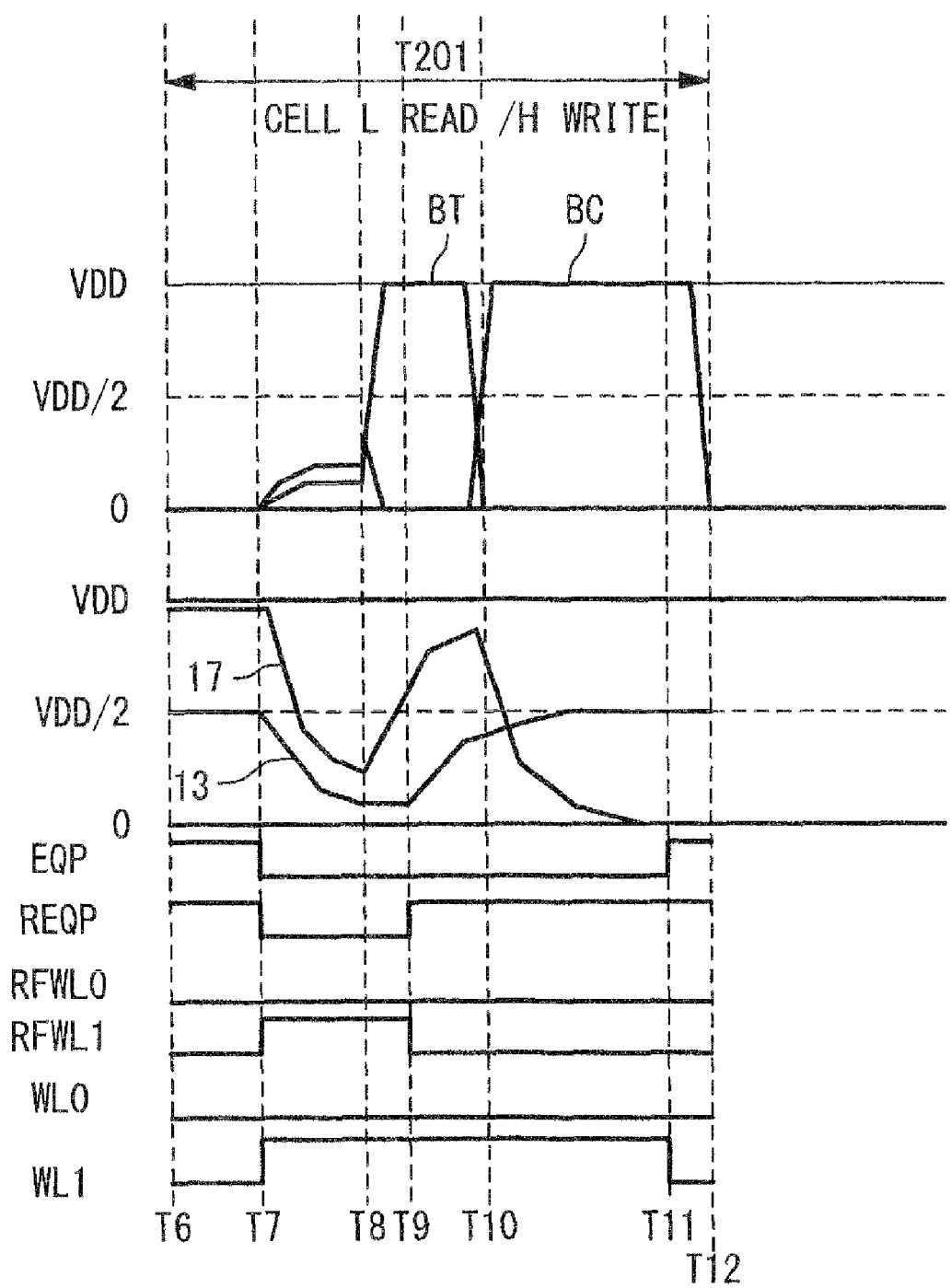
FIG. 5 shows time charts of the operation of the DRAM in the first embodiment of the present invention.

Referring to FIGS. 4 and 5, details of write and read operations of the DRAM according to the first embodiment of the present invention will be described. FIGS. 4 and 5 shows time charts in the write and read operations of the DRAM according to the present invention. Referring to FIG. 4, a case where a low level data "0" is read (cell L read) from the memory cell capacitance 21 connected to the word line WL0, and a high level data "1" is written (cell H write) to the memory cell capacitance 21 will be described.

During a period from time T0 to time T1, the precharge control signal EQP of a high level activates the precharge circuit 102 to precharge the bit lines BT and BC to the ground voltage GND (a precharging operation and an equalizing operation). At this time, the write signal REQP of a high level activates the N-channel transistors 10 and 14, and thereby charges are stored in the reference cell capacitances 8 and 15 from the VDD/2 nodes (a reference voltage supplying operation). These operations result in the bit lines BT and BC of the ground voltage GND, and the reference cell nodes 9 and 13 in the voltage of VDD/2 during the period from the time T0 to the time T1.

At the time T1, each of the precharge control signal EQP and the write signal REQP transits to a low level, and also the word line WL0 and the reference word line RFWL0 are activated. The precharge control signal EQP and the write signal REQP of the low levels stop the precharging operation and the equalizing operation for the bit lines BT and BC, and the reference voltage supplying operation. Also, the word line WL0 is activated, and therefore charges having accumulated in the memory cell capacitance 21 are re-distributed between the memory cell capacitance 21 and a parasitic capacitance of the bit line BC. At the same time, the reference word line RFWL0 is activated, and therefore charges having accumulated in the reference cell capacitance 8 are re-distributed between the reference cell capacitance 8 and a parasitic capacitance of the bit line BT. As a result of the charge re-distribution, a voltage difference occurs between the bit lines BT and BC. This brings the DRAM into a state that data can be read from the memory cell (memory cell capacitance 21 in this case) connected to the activated word line.

After the completion of the precharging operation, when the latch type differential sense amplifier circuit supply voltage SETP transits to a high level at time T2, the latch type differential sense amplifier circuit 101 is activated, and starts to perform an amplifying operation for a differential signal That is, an access operation (read or write) to the memory cell is started. The latch type differential sense amplifier circuit 101 amplifies the voltage difference between the bit lines BT and BC, and thereby the data is read from the memory cell connected to the activated word line. In this case, the amplification action causes the bit lines BT and BC to be amplified to the voltages of VDD and GND, respectively, and the "0" level data in the cell capacitance 21 to be read.

On the other hand, immediately after the sense amplifier has been activated, the reference memory cell is charged (reference voltage supplying operation). Specifically, at time T3, the reference word line RFWL0 is deactivated, and instead, the write signal REQP transits to the high level. Based on this, the N-channel transistors 10 and 14 are turned on, the connection between the reference memory cell node 9 and the bit line BT is disconnected, and charges are accumulated in the reference cell capacitances 8 and 15 from the power supplies (power supply voltage VDD/2).

At time T4 after the reference voltage supplying operation, by setting one of the bit lines BT and BC (bit line BC in this case) to the voltage of VDD, and the other (bit line BT in this case) to the ground voltage GND, write to the memory cell is started. In this case, the data "1" is written from the bit line BC to the memory cell capacitance 21. After the writing to the memory cell, when the precharge signal EQP is activated, and the word line WL0 is deactivated at time T5, a potential of the bit line pair is again set to the ground voltage GND (precharging operation).

Next, referring to FIG. 5, a case where a high level data "1" is read (cell H read) from the capacitance 16 of the memory cell connected to the word line WL1, and a low level data "0" is written (cell L write) to the memory cell capacitance 21 will be described.

During a period from time T6 to time T7, the precharge control signal EQP of the high level activates the precharge circuit 102 to precharge the bit lines BT and BC to the ground voltage GND (the precharging operation and the equalizing operation). At this time, the write signal REQP of the high level activates the N-channel transistors 10 and 14, to store charges in the reference cell capacitances 8 and 15 from the VDD/2 nodes (reference voltage supplying operation). Though these operations, the bit lines BT and BC are set to the ground voltage GND, and the reference cell nodes 9 and 13 are set to the voltage of VDD/2 during the period from the time T6 to the time T7.

At the time T7, each of the precharge control signal EQP and the write signal REQP transits to the low level, and also the word line WL1 and reference word line RFWL1 are activated. The precharge control signal EQP and the write signal REQP of the low level stop the precharging operation and the equalizing operation for the bit lines BT and BC, and the reference voltage supplying operation. Also, the word line WL1 is activated, and therefore charges having accumulated in the memory cell capacitance 16 are re-distributed between the memory cell capacitance 16 and the parasitic capacitance of the bit line BT. At the same time, the reference word line RFWL1 is activated, and therefore charges having accumulated in the reference cell capacitance 15 are re-distributed between the reference cell capacitance 15 and the parasitic capacitance of the bit line BC. As a result of the re-distribution, a voltage difference is generated between the bit lines BT and BC. Thus, the DRAM is set to a state that data can be read from the memory cell (memory cell capacitance 16 in this case) connected to the activated word line.

After the completion of the precharging operation, when the latch type differential sense amplifier circuit supply voltage SETP transits to the high level at time T8, the latch type differential sense amplifier circuit 101 is activated, and starts to perform an amplifying operation for the differential signal. The latch type differential sense amplifier circuit 101 amplifies the voltage difference between the bit lines BT and BC, to read a data from the memory cell connected to the activated word line. In this case, through the amplifying operation, the bit lines BT and BC are amplified to the voltages of VDD and GND, respectively, and the data "1" in the cell capacitance 21 can be read.

On the other hand, immediately after the sense amplifier has been activated, the reference memory cell is charged (reference voltage supplying operation) Specifically, at time T9, the reference word line RFWL1 is deactivated, and instead, the write signal REQP transits to the high level. Thus, the N-channel transistors 10 and 14 are turned on, the connection between the reference memory cell node 9 and the bit line BT is in the disconnection state, and charges are stored in the reference cell capacitances 8 and 15 from the power supply (power supply voltage VDD/2).

At time T10 after the reference voltage supplying operation, by setting one of the bit lines BT and BC (bit line BC in this case) to the voltage of VDD, and the other (bit line BT in this case) to the ground voltage GND, a writing operation to the memory cell is started. In this case, "0" is written to the memory cell capacitance 16 from the bit line BT. After the writing operation to the memory cell, when the precharge signal EQP is activated, and the word line WL1 is deactivated at time T11, the potential of the bit line pair is again set to the ground voltage GND (precharging operation).

Through the operations as described above, the GND sensing and direct reference cell writing system can obtain larger effects in the amplifying operation and the precharging operations than the conventional VDD/2 bit line precharge system, and therefore achieve a wider operating range.

Figure 2:
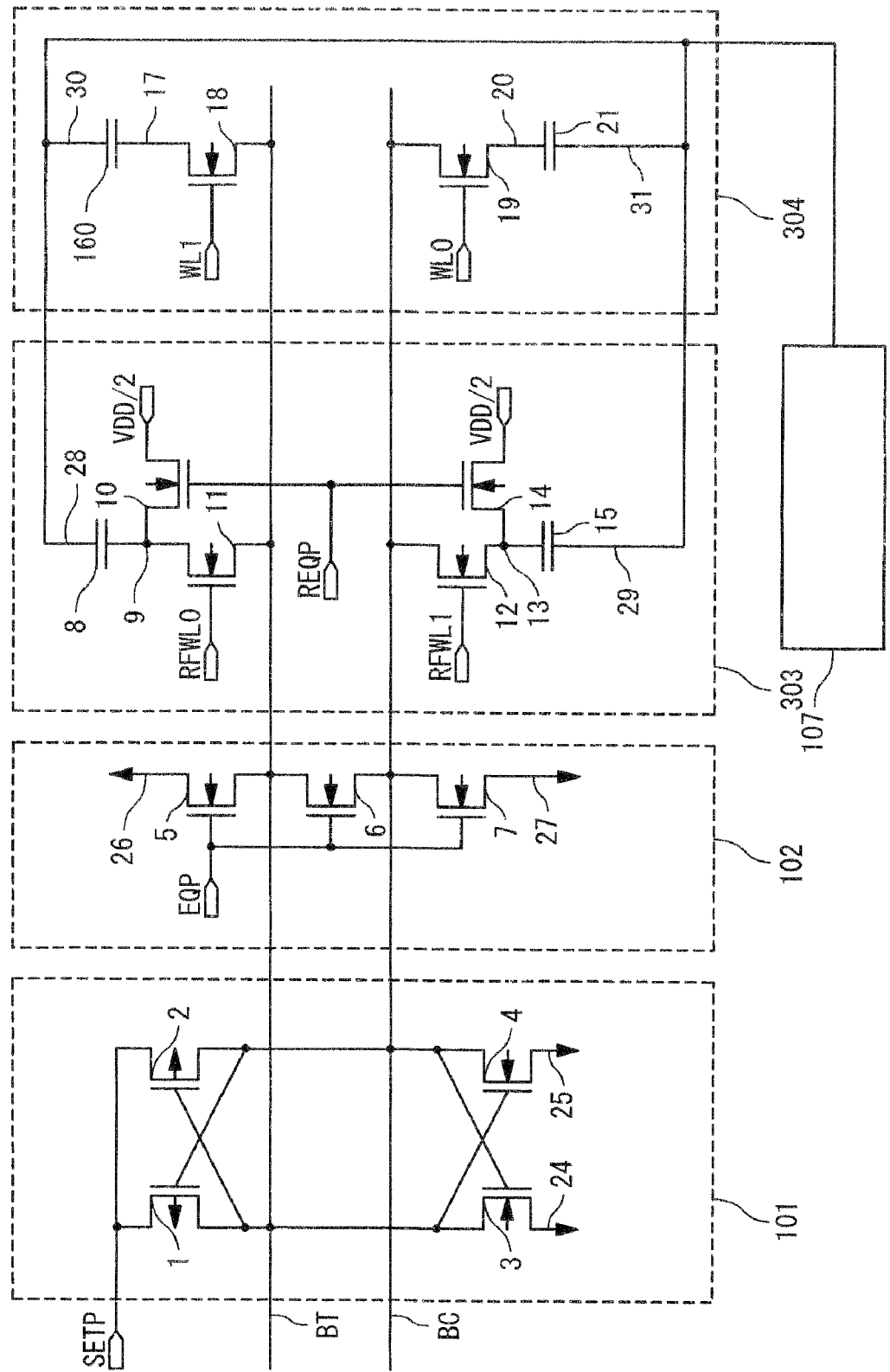
FIG. 2 is a circuit diagram illustrating a configuration of a DRAM according to another conventional technique.

Also, in the present invention, the opposite electrode node 32 of the memory cell and that 33 of the reference cell are separated from each other, and the voltage of the opposite electrode node 33 of the reference cell is fixed at the ground voltage GND. Therefore, a coupling noise does not superimpose between the opposite electrode node 32 and the reference cell opposite electrode node 33. For this reason, the deterioration of the sensing margin due to the coupling noise superimposed between the opposite electrode node 32 and 33 as in the DRAM illustrated in FIG. 2 can be prevented. That is, according to the present invention, a sensing margin in the DRAM of the GND sensing and direct reference cell writing system can be improved.

In the conventional technique, along with the voltage variations of the reference cell nodes 9 and 13, current flows from the opposite electrode node 28 or 29 of the reference memory cell to the plate potential supply circuit 107. On the other hand, in the DRAM according to the present invention, if the voltage of the reference cell nodes 9 or 13 is varied, current flows from the opposite electrode node 33 to the ground voltage GND.

Now defining "Vhvc1pA" as the voltage of the opposite electrode node 33 of the reference memory cell upon the precharge, and "Vhvc1pB" as that of the opposite electrode node 33 of the reference memory cell upon the GND sensing, the voltage of the opposite electrode node 33 of the reference memory cell can be set to any value, if Vhvc1pA and Vhvc1pB are equal to each other. It should be noted that the opposite electrode node 33 is connected to the ground voltage GND, and is therefore set to the ground voltage GND. On the other hand, the voltage of the reference cell node 9 or 13 approximately becomes a voltage between the voltage of VDD/2 and the ground voltage GND. For this reason, the reference cell capacitance 8 or 15 will be applied with a voltage of up to the voltage of VDD/2. This is within an allowable range of a breakdown voltage of the capacitance, and therefore the opposite electrode node 32 of the memory cell and the opposite electrode node 33 of the reference memory cell can be separated from each other without breaking the capacitance insulating films.

Also, assuming that a capacitance of the reference cell capacitance 8 or 15 is Cr, a voltage of the reference cell node 9 or 13 upon the direct reference cell write is Vr≈VDD/2, voltages on the bit lines BT and BC are Vd, and parasitic capacitances of the bit lines BT and BC are Cd, a total of a charge amount of the reference cell capacitance 8 or 13 and a charge amount of the bit lines BT and BC upon the precharge is Cr×(Vr−Vhvc1pA) because Vd=0. On the other hand, a total of the charge amount of the reference cell capacitance 8 or 13 and the charge amount of the bit lines BT and BC upon the GND sensing is Cd×Vd+Cr×(Vd−Vhvc1pB). Both of them are equal to each other from the Low of conservation of charge, and therefore the voltage Vd of the bit line on the reference cell capacitance side upon the GND sensing is expressed by the following equation (1):

$$Vd=(Cr \times Vr+Cr \times (Vhvc1pA-Vhvc1pB))/(Cd+Cr) \quad (1)$$

In the present embodiment, the opposite electrode node 33 is connected to the ground voltage GND, and therefore the voltages Vhvc1pA and Vhvc1pB are fixed to 0 V. For this reason, the voltage Vd on the bit line upon the GND sensing in the DRAM is expressed by the following equation (2):

$$Vd=Cr \times Vr/(Cd+Cr) \quad (2)$$

In the present invention, the opposite electrode node 32 of the memory cell capacitance 16 or 21 and the opposite electrode node 33 of the reference cell capacitance 8 or 15 are physically separated from each other, and therefore noises generated at the opposite electrode nodes 32 and 33 are not superimposed on each other.

Also, giving that the memory cell capacitance 16 or 21 is represented by Cs, the voltage Vsd on the bit line upon the reading the high level data "1" from the memory cell is expressed by the following equation (3):

$$Vsd=Cs \times VDD/(Cd+Cs) \quad (3)$$

On the other hand, the voltage Vsd on the bit line upon the reading the low level data "0" from the memory cell is 0 V.

Further, because Cs=Cr, the voltage difference ΔV between the bit lines is expressed by the following equation (4) in any of the cell H or the cell L:

$$\Delta V=0.5 \times VDD \times Cs/(Cd+Cr) \quad (4)$$

As described, the voltage difference ΔV between the bit lines takes a value not influenced by the voltage of the opposite electrode node 32 or 33. For this reason, in the DRAM according to the present invention, the voltage difference obtained only by the bit line capacitance, the memory cell capacitance, and the reference cell capacitance is sensed, and therefore any read or write error due to defective sensing as in the conventional technique does not occur.

Also, in the conventional example, if a response performance of the plate potential supply circuit 107 is low, the voltage variations of the memory cell nodes 17 and 20 cannot be suppressed during a write period or a read period, and therefore the write error or the read error occurs. However, in the present invention, the suppression of voltage variations of the opposite electrode nodes due to the coupling noise as in the conventional example is not required, and therefore the plate potential supply circuit 107 may have a low response performance. Also, even if a wiring impedance from the opposite electrode node 32 of the memory cell to the plate potential supply circuit 107 is high, the sensing margin is not deteriorated.

Specifically, referring to FIG. 5, upon the cell H read (during the period from the time T7 to the time T9 in the cycle T201), i.e., during a period from the GND sensing to the amplifying operation, the voltage of the memory cell node 17 varies as from the voltage of VDD (time T7) to Vsd=Cs× VDD/(Cd+Cs) (time T7 to time T9), to the voltage of VDD (time T9 and later). For this reason, coupling noise from the memory cell nodes 17 or 20 to the opposite electrode node 32 is cancelled during the period from the time T7 to the time T9. On the other hand, referring to FIG. 4, upon the cell L read (during the period from the time T1 to the time T3 in the cycle T200), the memory cell node 20 is not varied in voltage, and therefore the influence of the coupling noise does not practically occur. From the above, in the present invention, the sensing margin is not deteriorated by the response performance of the plate potential supply circuit 107 or the wiring impedance to the plate potential supply circuit 107.

Second Embodiment

Referring to FIG. 6, the DRAM using the direct reference cell writing system according to a second embodiment of the present invention will be described.

(Configuration)

FIG. 6 is a circuit diagram illustrating a configuration of a part of a DRAM according to the second embodiment of the present invention. The DRAM in the first embodiment includes the reference voltage supply circuit 103 in which the opposite electrode node 33 of the reference memory cell is connected to the lower voltage power supply (GND voltage). However, the DRAM in the second embodiment includes a reference voltage supply circuit 203 in which an opposite electrode node 34 of a reference memory cell is connected to a higher voltage power supply (VDD voltage), instead. The configuration of a remaining portion of the DRAM is the same as that in the first embodiment.

(Operation)

An operation different from that of the first embodiment will be described.

The current flows from the opposite electrode node 33 to the ground voltage GND along with the voltage variation of the reference cell node 9 or 13 in the first embodiment but the current flows from the opposite electrode node 34 to the higher voltage power supply VDD in the second embodiment.

Defining a voltage of the opposite electrode node 34 of a reference memory cell upon precharge as "Vhvc1pA", and a voltage of the opposite electrode node 34 of the reference memory cell upon GND sensing as "Vhvc1pB", the voltage of the opposite electrode node 34 of the reference memory cell can be set to any value, if the voltages Vhvc1pA and Vhvc1pB are equal to each other. It should be noted that the opposite electrode node 34 is connected to a VDD node, and therefore set to the voltage of VDD. On the other hand, a voltage of reference cell node 9 or 13 is approximately in a range of the voltage of VDD/2 and the ground voltage GND. For this reason, the reference cell capacitance 8 or 15 will be applied with a voltage of up to the voltage of VDD/2. This is within an allowable range of a breakdown voltage of the capacitances, and therefore the opposite electrode node 32 of the memory cell and the opposite electrode node 34 of the reference memory cell can be separated from each other without breaking capacitance insulating films.

Also, assuming that the reference cell capacitance 8 or 15 is Cr, voltage of the reference cell node 9 or 13 upon direct reference cell writing is Vr≈VDD/2, a voltage on the bit line BT or BC is Vd, and a parasitic capacitance of the bit line BT or BC is Cd, a total of a charge mount of the reference cell capacitance 8 or 13 and a charge amount of the bit line BT or BC upon the precharge is Cr×(Vr−Vhvc1pA) because Vd=0. On the other hand, a total of a charge amount of the reference cell capacitance 8 or 13 and a charge amount of the bit line BT or BC upon the GND sensing is Cd×Vd+Cr×(Vd−Vhvc1pB) Both of them are equal to each other from the Low of conservation of charge, and therefore the voltage Vd of the bit line on a reference cell capacitance side upon the GND sensing is expressed by the above equation (1).

In the present embodiment, the opposite electrode node 34 is connected to the VDD node, and therefore Vhvc1pA and Vhvc1pB are fixed to the voltage of VDD. For this reason, the voltage Vd on the bit line upon the GND sensing in the DRAM in the second embodiment is expressed by the above equation (2).

Similarly to the first embodiment, a voltage difference ΔV between the bit lines in the second embodiment is expressed by the equation (4). As described, even in the second embodiment, the opposite electrode node 32 of the memory cell capacitance 16 or 21 and the opposite electrode node 34 of the reference cell capacitance 8 or 15 are physically separated from each other, and therefore noises generated at the opposite electrode nodes 32 and 34 are not superimposed on each other. For this reason, the maximum voltage difference in the GND sensing and direct reference cell writing system can be obtained without any influence of the voltages at the opposite electrode nodes.

As described above, effects obtained in the second embodiment are the same as those in the first embodiment. However, the potential connected to the opposite electrode node 34 of the reference cell capacitance 8 or 15 is VDD, and therefore an impedance is lower than a case where the node is connected to the ground voltage GND or any other voltage in a wiring structure, and a wiring area can be reduced.

Also, similarly to the first embodiment, according to the DRAM in the second embodiment, a sensing margin is not deteriorated because of a response performance of a plate potential supply circuit 107 or a wiring impedance to the plate potential supply circuit 107.

In the present invention, the coupling noise from the opposite electrode node 32 or 34 is absorbed by the power supply. For this reason, the deterioration of the sensing margin due to the coupling noise can be prevented without requiring a control circuit for controlling the voltage at the opposite electrode node 32 or 34, differently from Japanese Patent Application Publication (JP-A-Heisei 11-026720).

The present invention has been described in detail. However, the present invention is not limited to the above-described embodiments, but any modification is possible without departing from the scope of the present invention. In the first and second embodiments, the opposite electrode node of the reference cell is connected to the higher voltage side power supply (VDD) or the lower voltage side power supply (GND). However, the opposite electrode node may be fixed to any voltage between the voltages VDD and GND. In this case, the opposite electrode node of the reference memory cell and the opposite electrode node of the memory cell should be separated from each other.

What is claimed is:

1. A dynamic type semiconductor memory device comprising:
   a sense amplifier connected with a bit line pair to amplify and sense a voltage difference on said bit line pair;
   a precharge circuit configured to precharge said bit line pair to a power supply voltage on a lower side in response to a first control signal;
   a memory cell capacitance having one end which is connected with said bit line pair through a first switch circuit which is controlled in response to a signal on a word line; and
   a reference cell capacitance having one end which is connected with said bit line pair through a second switch circuit which is controlled in response to a signal on a reference word line;
   wherein the other end of said memory cell capacitance and the other end of said reference cell capacitance are electrically separated.

2. The dynamic type semiconductor memory device according to claim 1, wherein the other end of said memory cell capacitance is fixed to a first voltage, and the other end of said reference cell capacitance is fixed to a second voltage.

3. The dynamic type semiconductor memory device according to claim 2, wherein the second voltage is the power supply voltage on the lower side.

4. The dynamic type semiconductor memory device according to claim 2, wherein the second voltage is a power supply voltage on a higher side.

5. The dynamic type semiconductor memory device according to claim 1, wherein said one end of said reference cell capacitance is connected through a third switch circuit with a node to which a reference voltage is supplied, and
   said third switch circuit controls a connection between said one end of said reference cell capacitance and said node in response to a second control signal.

6. The dynamic type semiconductor memory device according to claim 5, wherein said reference voltage is an intermediate voltage between a power supply voltage on a higher side and the power supply voltage on the lower side.

7. The dynamic type semiconductor memory device according to claim 2, wherein said first voltage is an intermediate voltage between a power supply voltage on a higher side and the power supply voltage on the lower side.

8. An operation method of a dynamic type semiconductor memory device, comprising:

prechargingabit line pair to a power supply voltage on a lower side;

supplying a reference voltage to a reference cell capacitance;

redistributing charges stored in said reference cell capacitance between said reference cell capacitance and said bit line pair in a state that one end of said reference cell capacitance and one end of a memory cell capacitance are electrically separated; and connecting said memory cell capacitance with said bit line pair.

9. The operation method of a dynamic type semiconductor memory device according to claim 8, further comprising:

fixing one end of said memory cell capacitance is fixed to a first voltage, and one end of said reference cell capacitance is fixed to a second voltage.

10. The operation method of a dynamic type semiconductor memory device according to claim 9, wherein the second voltage is the power supply voltage on the lower side.

11. The operation method of a dynamic type semiconductor memory device according to claim 10, wherein the second voltage is a power supply voltage on a higher side.

12. The operation method of a dynamic type semiconductor memory device according to claim 8, wherein said reference voltage is an intermediate voltage between a power supply voltage on a higher side and the power supply voltage on the lower side.

13. The operation method of a dynamic type semiconductor memory device according to claim 9, wherein said first voltage is an intermediate voltage between the power supply voltage on the higher side and the power supply voltage on the lower side.

* * * * *